US012801032B2

(12) United States Patent
Lee et al.

(10) Patent No.: US 12,801,032 B2
(45) Date of Patent: Nov. 17, 2026

(54) METHOD OF MANUFACTURING INTEGRATED CIRCUIT DEVICE BY USING METROLOGY MARK FOR PHOTOLITHOGRAPHY PROCESS

(71) Applicant: SAMSUNG ELECTRONICS CO., LTD., Suwon-si (KR)

(72) Inventors: Muyoung Lee, Suwon-si (KR); Jeonghyun Kim, Suwon-si (KR); Ikjun Jang, Suwon-si (KR); Sangho Jo, Suwon-si (KR); Ilhwan Kim, Suwon-si (KR); Jonghwa Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 43 days.

(21) Appl. No.: 19/173,298

(22) Filed: Apr. 8, 2025

(65) Prior Publication Data

US 2026/0133500 A1 May 14, 2026

(30) Foreign Application Priority Data

Nov. 13, 2024 (KR) ........................ 10-2024-0161331

(51) Int. Cl.
*G03F 7/00* (2006.01)
*H10W 20/00* (2026.01)

(52) U.S. Cl.
CPC ...... *G03F 7/70633* (2013.01); *G03F 7/70683* (2013.01); *G03F 7/706845* (2023.05); *G03F 7/706849* (2023.05); *H10W 20/031* (2026.01)

(58) Field of Classification Search
CPC ............. G03F 7/70633; G03F 7/70683; G03F 7/706845; G03F 7/706849; H10W 20/031
See application file for complete search history.

(56) References Cited

U.S. PATENT DOCUMENTS 7,190,824 B2 3/2007 Chen
7,193,715 B2 * 3/2007 Smedt ................ G01N 21/4788 430/30
9,846,359 B1 12/2017 Oh et al.
(Continued)

FOREIGN PATENT DOCUMENTS

KR 10-0564563 B1 3/2006
KR 10-2011-0115316 A 10/2011
(Continued)

*Primary Examiner* — Dominic J Bologna
(74) *Attorney, Agent, or Firm* — Sughrue Mion, PLLC

(57) ABSTRACT

A method of manufacturing an integrated circuit device, includes: forming a bottom metrology mark; determining a bottom grating integrated measurement value, based on a first average value of a first alignment measurement value for a first bottom grating and a second alignment measurement value for a second bottom grating, wherein the first alignment measurement value and the second alignment measurement value are measured on the bottom metrology mark; forming a top grating including a plurality of third keys formed at a third vertical level that is higher than each of the first vertical level and the second vertical level on the lower structure; and measuring an overlay between the top grating and both of the first bottom grating and the second bottom grating, based on a measurement value of the top grating and based on the bottom grating integrated measurement value.

20 Claims, 13 Drawing Sheets

(56) References Cited

U.S. PATENT DOCUMENTS

| | | | | |
|---|---|---|---|---|
| 9,916,652 | B2 | 3/2018 | Weinberg et al. | |
| 2008/0218767 | A1* | 9/2008 | Mos | G03F 7/70633 356/601 |
| 2011/0238365 | A1* | 9/2011 | Li | G03F 7/70633 702/150 |
| 2013/0208279 | A1* | 8/2013 | Smith | G01B 11/26 356/401 |
| 2024/0053687 | A1* | 2/2024 | Levinski | G03F 7/70633 |
| 2024/0060916 | A1 | 2/2024 | Yang et al. | |

FOREIGN PATENT DOCUMENTS

| | | | |
|---|---|---|---|
| KR | 10-2460132 | B1 | 10/2022 |
| KR | 10-2023-0032478 | A | 3/2023 |

* cited by examiner

METHOD OF MANUFACTURING INTEGRATED CIRCUIT DEVICE BY USING METROLOGY MARK FOR PHOTOLITHOGRAPHY PROCESS

CROSS-REFERENCE TO RELATED APPLICATION

This application is based on and claims priority under 35 U.S.C. § 119 to Korean Patent Application No. 10-2024-0161331, filed on Nov. 13, 2024, in the Korean Intellectual Property Office, the disclosure of which is incorporated by reference herein in its entirety.

BACKGROUND

The disclosure relates to a method of manufacturing an integrated circuit device, and more particularly, to a method of manufacturing an integrated circuit device by using a metrology mark and a photolithography process.

Along with the higher integration of integrated circuit devices, critical dimensions (CDs) of photoresist patterns in manufacturing processes of integrated circuit devices more and more decrease. Thus, to improve the CD uniformity of photoresist patterns having fine CDs, precisely and reliably monitor photolithography processes are needed.

SUMMARY

Provided is a method of manufacturing an integrated circuit device. Provided is a method being capable of reducing the area required to form a metrology mark used in a photolithography process and capable of reducing the time required for overlay measurement and/or alignment measurement performed by using the metrology mark.

According to an aspect of the disclosure, a method of manufacturing an integrated circuit device, includes: forming a bottom metrology mark that comprises: a first bottom grating including a plurality of first keys and a second bottom grating including a plurality of second keys, wherein the plurality of first keys are formed at a first vertical level on a lower structure and at a first time instance, and wherein the plurality of second keys are formed, at the first vertical level on the lower structure or at a second vertical level that is higher than the first vertical level, at a second time instance that is different from the first time instance; determining a bottom grating integrated measurement value, based on a first average value of a first alignment measurement value for the first bottom grating and a second alignment measurement value for the second bottom grating, wherein the first alignment measurement value and the second alignment measurement value are measured on the bottom metrology mark; forming a top grating including a plurality of third keys that are formed at a third vertical level that is higher than each of the first vertical level and the second vertical level on the lower structure; and measuring an overlay between the top grating and both of the first bottom grating and the second bottom grating, based on a measurement value of the top grating and based on the bottom grating integrated measurement value.

According to an aspect of the disclosure, a method of manufacturing an integrated circuit device, includes: forming a front-end-of-line (FEOL) structure on a lower structure; and forming a back-end-of-line (BEOL) structure on the FEOL structure, wherein at least one of the forming of the FEOL structure and the forming of the BEOL structure includes measuring an overlay between an upper pattern and a lower pattern on the lower structure, and wherein the measuring of the overlay includes: forming a bottom metrology mark that includes: a first bottom grating including a plurality of first keys and a second bottom grating including a plurality of second keys, wherein the plurality of first keys are formed, at a first vertical level on a lower structure, at a first time instance, wherein the plurality of second keys are formed at the first vertical level on the lower structure or at a second vertical level that is higher than the first vertical level, at a second time distance that is different from the first time instance; determining a bottom grating integrated measurement value, based on a first average value of a first alignment measurement value for the first bottom grating and a second alignment measurement value for the second bottom grating, wherein the first alignment measurement value and the second alignment measurement value are measured on the bottom metrology mark; forming a top grating including a plurality of third keys, which are formed at a third vertical level that is higher than each of the first vertical level and the second vertical level on the lower structure; and measuring an overlay between the top grating and both the first bottom grating and the second bottom grating, based on a measurement value of the top grating and based on the bottom grating integrated measurement value.

According to an aspect of the disclosure, a method of manufacturing an integrated circuit device, includes: forming a first bottom grating, which includes a plurality of first keys, in a first area at a first vertical level on a lower structure through a first photolithography process; after the first bottom grating is formed, forming, through a second photolithography process, a second bottom grating, which includes a plurality of second keys, in the first area at the first vertical level on the lower structure or in a second area that is at a second vertical level higher than the first vertical level and that overlaps the first area in a vertical direction; determining a bottom grating integrated measurement value, based on an alignment measurement value measured on a bottom metrology mark including a combination of the first bottom grating and the second bottom grating; forming a top grating, which includes a plurality of third keys, at a third vertical level that is higher than each of the first vertical level and the second vertical level on the lower structure, through a third photolithography process; and measuring an overlay between the top grating and both the first bottom grating and the second bottom grating, based on a measurement value of the top grating and based on the bottom grating integrated measurement value.

BRIEF DESCRIPTION OF THE DRAWINGS

Embodiments will be more clearly understood from the following detailed description taken in conjunction with the accompanying drawings in which.

DETAILED DESCRIPTION

Figure 1:
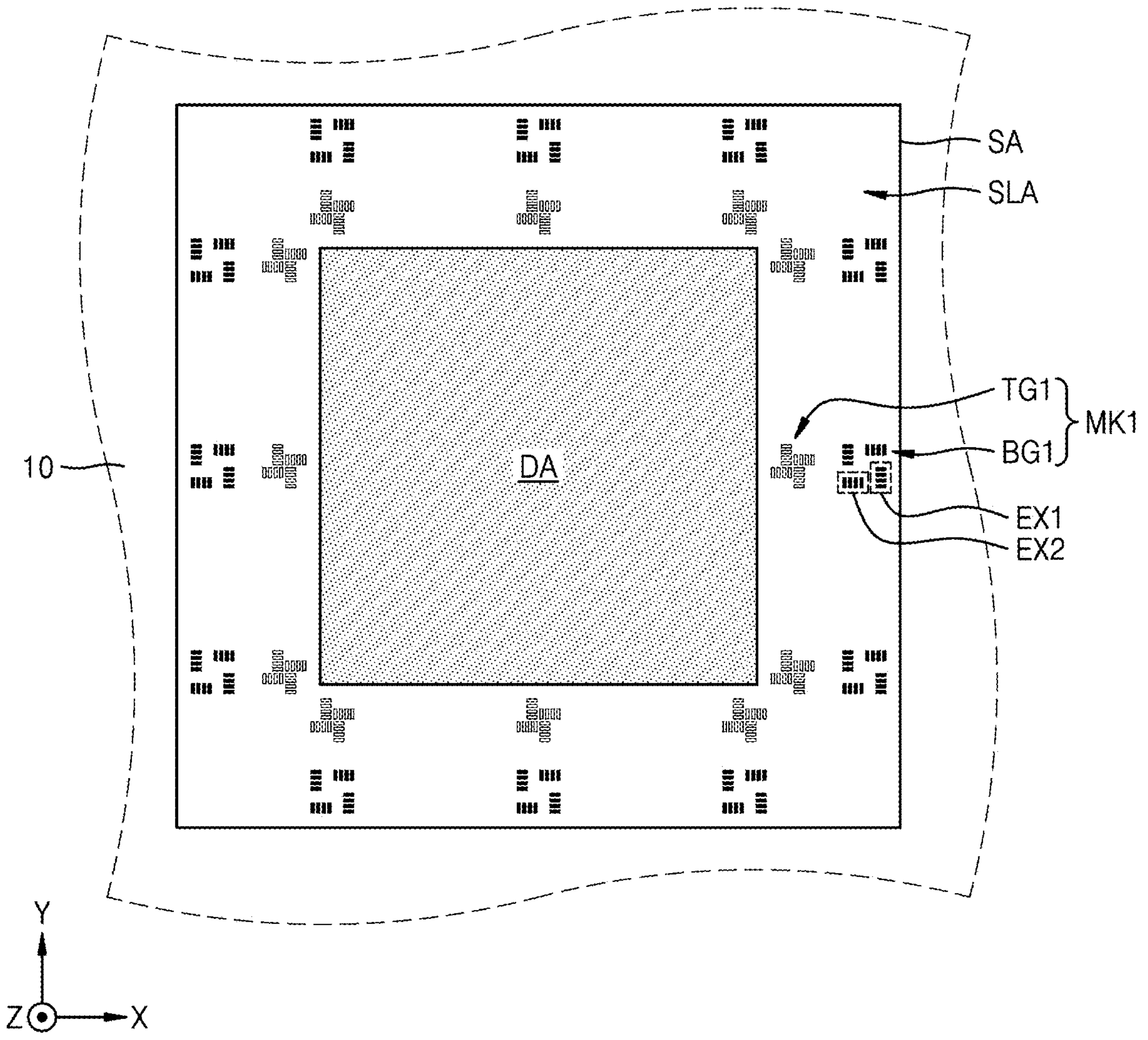
FIG. 1 is a schematic planar layout of a metrology mark that may be used in a method of manufacturing an integrated circuit device, according to embodiments.

Hereinafter, embodiments of the disclosure will be described in detail with reference to the accompanying drawings. Like components are denoted by like reference numerals throughout the specification, and repeated descriptions thereof are omitted.

FIG. 1 is a schematic planar layout of a metrology mark MK1 that may be used in a method of manufacturing an integrated circuit device, according to embodiments. An example of the metrology mark MK1 arranged on a lower structure 10 in one shot area SA is described with reference to FIG. 1. FIG. 1 illustrates advanced image metrology (AIM) marks, which may be used in overlay measurement, as an example of the metrology mark MK1.

Referring to FIG. 1, a plurality of metrology marks MK1 may be arranged, in one shot area SA, on the lower structure 10 (for example, the lower structure 10 shown in FIGS. 3A to 3D). Each of the plurality of metrology marks MK1 may include a bottom grating BG1 and a top grating TG1. The one shot area SA may include a device area DA and a scribe lane area SLA surrounding the device area DA in the viewpoint of an X-Y plane.

The device area DA may include a chip area that includes a cell array area and a peripheral circuit area of an integrated circuit device intended to be formed. Various feature patterns required to constitute an integrated circuit in the chip area may be arranged in each of the cell array area and the peripheral circuit area.

In some embodiments, each of the plurality of metrology marks MK1 may be used as an overlay key for measuring an overlay between feature patterns formed in the device area DA. In some embodiments, each of the plurality of metrology marks MK1 may be used as an alignment key for alignment between the lower structure 10 and a particular area of photolithography equipment that is used to perform a photolithography process for forming feature patterns on the lower structure 10. As used herein, the term "photolithography process" refers to a process of transferring an intended image pattern onto a lower structure, such as a wafer, by performing light-exposure by using a reticle or a photomask in which the image pattern to be transferred onto the lower structure is formed, and then, developing the transferred image pattern.

The bottom grating BG1 and the top grating TG1 may be respectively arranged at different vertical levels on or over the lower structure 10 (see FIGS. 3A to 3D). Herein, the different vertical levels mean that levels in a vertical direction (a Z direction) on or over the lower structure 10 are different. Although FIG. 1 illustrates a configuration in which the bottom grating BG1 and the top grating TG1 are apart from each other in a horizontal direction (an X direction or a Y direction in FIG. 1) not to overlap each other in the vertical direction (the Z direction) in the viewpoint of the X-Y plane, the bottom grating BG1 and the top grating TG1 may be arranged to at least partially overlap each other in the vertical direction (the Z direction).

As shown in FIG. 1, the top grating TG1 may be arranged closer to the device area DA than the bottom grating BG1 in the viewpoint of the X-Y plane. However, the disclosure is not limited to the above example embodiment. The top grating TG1 may be arranged to overlap the bottom grating BG1 in the vertical direction (the Z direction), or the bottom grating BG1 may be arranged closer to the device area DA than the top grating TG1 in the viewpoint of the X-Y plane. In some embodiments, each of the bottom grating BG1 and the top grating TG1 may include a plurality of line-and-space patterns.

Figure 2A:
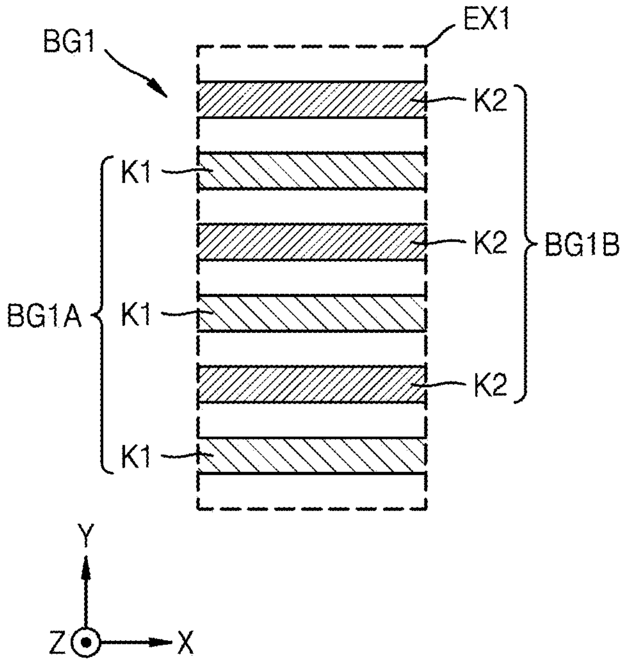
FIG. 2A is an enlarged plan view of a portion of a region EX1 of FIG. 1.
Figure 2B:
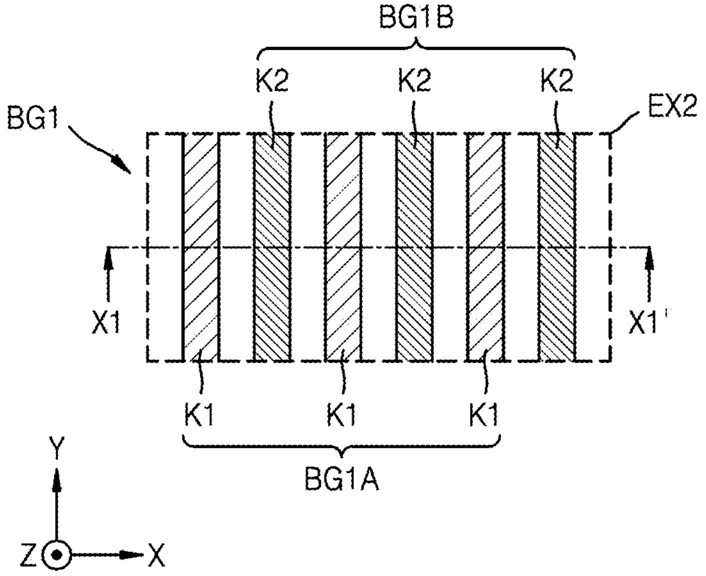
FIG. 2B is an enlarged plan view of a portion of a region EX2 of FIG. 1.

FIG. 2A is an enlarged plan view of a portion of a region EX1 of FIG. 1. FIG. 2B is an enlarged plan view of a portion of a region EX2 of FIG. 1.

Referring to FIGS. 2A and 2B, the bottom grating BG1 may include a first bottom grating BG1A including a plurality of first keys K1, which are formed at a first vertical level on the lower structure 10 through a first photolithography process, and a second bottom grating BG1B including a plurality of second keys K2, which are formed at a second vertical level, which is equal to or higher than the first vertical level on the lower structure 10, through a second photolithography process performed with a time difference from the first photolithography process. In other words, the first photolithography process is performed at a first time instance and the second photolithography process is performed at a second time instance that is different from the first time instance.

The second photolithography process may include a photolithography process performed after the first photolithography process is performed.

As shown in FIGS. 2A and 2B, in the viewpoint of the X-Y plane, the plurality of first keys K1 and the plurality of second keys K2 may be alternately arranged one-by-one in a first horizontal direction (the X direction) or a second horizontal direction (the Y direction), which is orthogonal to the vertical direction (the Z direction), in the bottom grating BG1 and may be aligned in a line in the first horizontal direction (the X direction) or the second horizontal direction (the Y direction). The first horizontal direction (the X direction) and the second horizontal direction (the Y direction) may be directions orthogonal to each other in the X-Y plane.

The plurality of first keys K1 and the plurality of second keys K2 may each include an embossed pattern or an engraved pattern. In some embodiments, at least one of each of the plurality of first keys K1 and each of the plurality of second keys K2 may include an embossed pattern. In some embodiments, at least one of each of the plurality of first keys K1 and each of the plurality of second keys K2 may include an engraved pattern, such as a trench.

FIGS. 3A to 3D are cross-sectional views respectively illustrating various embodiments of the bottom grating BG1. FIGS. 3A to 3D each illustrate an example of a cross-sectional configuration taken along a line X1-X1' of FIG. 2B.

Figure 3A:
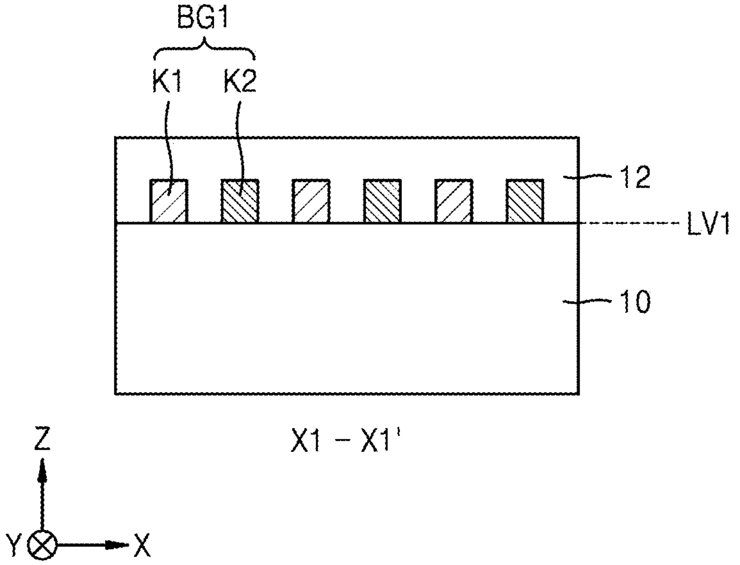
FIGS. 3A to 3D are cross-sectional views each illustrating a bottom grating that may be used in a method of manufacturing an integrated circuit device, according to embodiments.

Referring to FIG. 3A, in the bottom grating BG1, the plurality of first keys K1 and the plurality of second keys K2 may each include an embossed pattern and may be arranged equally at a first vertical level LV1 on the lower structure 10. The plurality of first keys K1 and the plurality of second keys K2 may be alternately arranged one-by-one in the first horizontal direction (the X direction) at the first vertical level LV1 and may be aligned in a line in the first horizontal direction (the X direction).

The lower structure 10 may include a substrate including a semiconductor layer, such as silicon (Si) or germanium (Ge), or a compound semiconductor layer, such as SiGe, SiC, GaAs, InAs, InGaAs, or InP. As used herein, each of the terms "SiGe", "SiC", "GaAs", "InAs", "InGaAs", and "InP" refers to a material including elements contained in each term and is not a chemical formula representing a stoichiometric relationship. The lower structure 10 may further include a conductive region, for example, an impurity-doped well or an impurity-doped structure. The lower structure 10 may further include circuit patterns arranged on the substrate. In some embodiments, the circuit patterns may include a plurality of select devices, for example, a plurality of cell transistors, constituting a plurality of memory cells arranged in the device area DA (see FIG. 1). In some embodiments, the circuit patterns may include logic transistors connected to a logic circuit or a peripheral circuit. The lower structure 10 may further include a plurality of insulating structures covering the circuit patterns.

For example, each of the plurality of first keys K1 and the plurality of second keys K2 may include an insulating film, doped polysilicon, a metal film, a metal nitride film, or a combination of these films. Each of the plurality of first keys K1 and the plurality of second keys K2 may be covered by an insulating film 12.

Figure 3B:
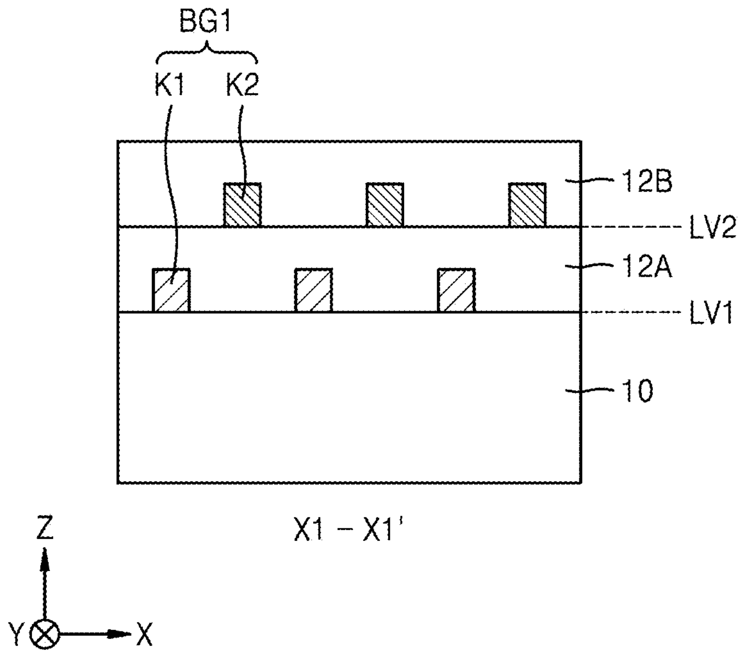

Referring to FIG. 3B, in the bottom grating BG1, the plurality of first keys K1 and the plurality of second keys K2 may each include an embossed pattern, the plurality of first keys K1 may be arranged at the first vertical level LV1 on the lower structure 10, and the plurality of second keys K2 may be arranged at a second vertical level LV2 that is higher than the first vertical level LV1 on the lower structure 10. In the viewpoint of the X-Y plane, the plurality of first keys K1 and the plurality of second keys K2 may be aligned in a line in the first horizontal direction (the X direction). More detailed configurations of the plurality of first keys K1 and the plurality of second keys K2 are the same as those described with reference to FIG. 3A. The plurality of first keys K1 may be covered by a first insulating film 12A, and the plurality of second keys K2 may be arranged on the first insulating film 12A and may be covered by a second insulating film 12B.

Figure 3C:
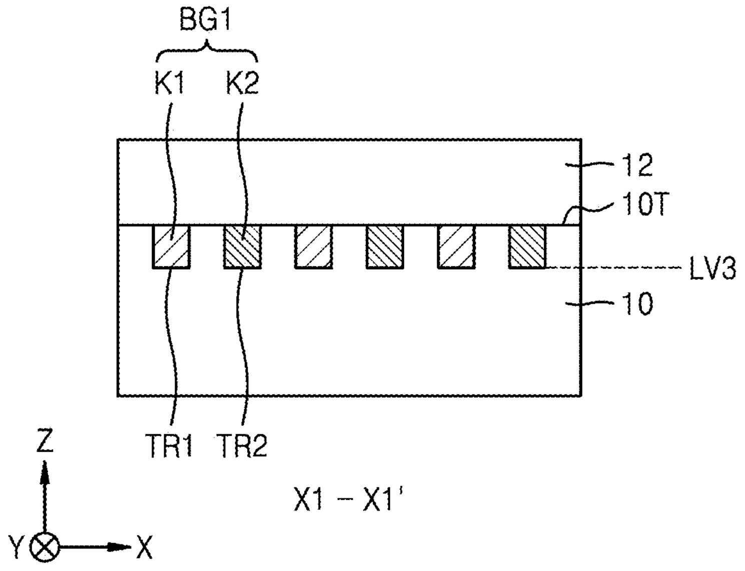

Referring to FIG. 3C, in the bottom grating BG1, each of the plurality of first keys K1 may include an engraved pattern including a first trench TR1 formed in the lower structure 10, each of the plurality of second keys K2 may include an engraved pattern including a second trench TR2 formed in the lower structure 10, and the plurality of first keys K1 and the plurality of second keys K2 may be arranged at a third vertical level LV3 that is lower than an upper surface 10T of the lower structure 10. The plurality of first keys K1 and the plurality of second keys K2 may be alternately arranged one-by-one in the first horizontal direction (the X direction) at the third vertical level LV3 and may be aligned in a line in the first horizontal direction (the X direction).

A plurality of first trenches TR1 and a plurality of second trenches TR2 respectively constituting the plurality of first keys K1 and the plurality of second keys K2 may each be filled with an insulating film, doped polysilicon, a metal film, a metal nitride film, or a combination of the above example films. But the disclosure is not limited to the above example embodiment. The plurality of first keys K1 and the plurality of second keys K2 may each be covered by an insulating film 12.

Figure 3D:
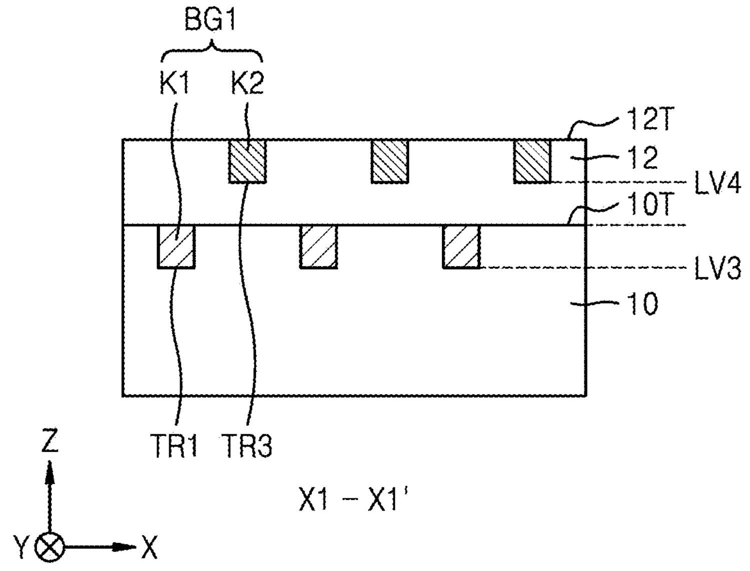

Referring to FIG. 3D, in the bottom grating BG1, the plurality of first keys K1 may each include an engraved pattern including a first trench TR1 formed in the lower structure 10 and may be arranged at the third vertical level LV3 that is lower than the upper surface 10T of the lower structure 10. The plurality of second keys K2 may each include an engraved pattern including a third trench TR3 formed in the insulating film 12, which covers the plurality of first keys K1, and may be arranged at a fourth vertical level LV4 that is higher than the third vertical level LV3 and lower than an upper surface 12T of the insulating film 12. In the viewpoint of the X-Y plane, the plurality of first keys K1 and the plurality of second keys K2 may be aligned in a line in the first horizontal direction (the X direction). A plurality of first trenches TR1 and a plurality of third trenches TR3 respectively constituting the plurality of first keys K1 and the plurality of second keys K2 may each be filled with an insulating film, doped polysilicon, a metal film, a metal nitride film, or a combination of the above example films. But the disclosure is not limited to the above example embodiment.

Figure 4:
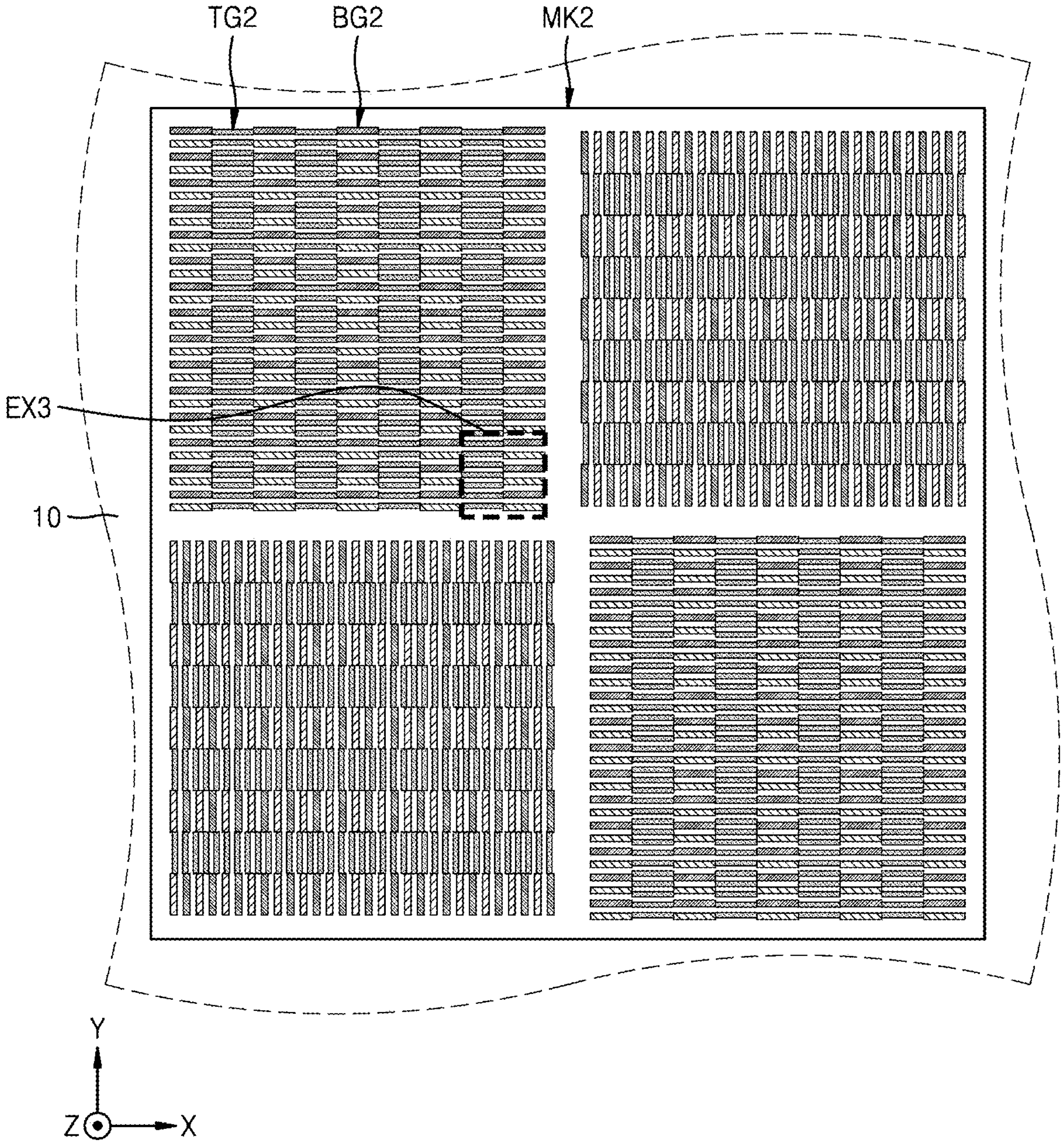
FIG. 4 is a schematic planar layout of a metrology mark that may be used in a method of manufacturing an integrated circuit device, according to some embodiments.
Figure 5:
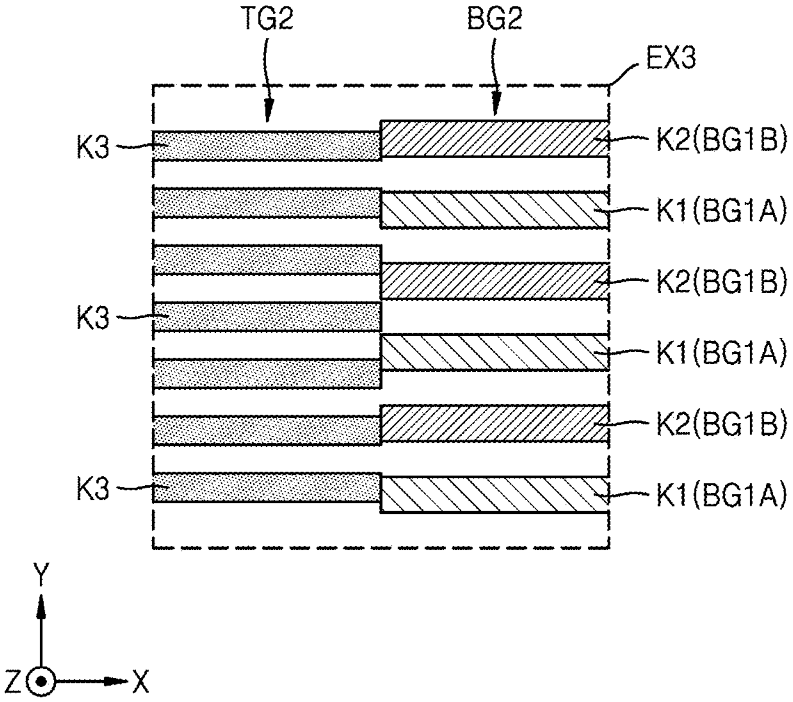
FIG. 5 is an enlarged plan view of a portion of a region EX3 of FIG. 4.

FIG. 4 is a schematic planar layout of a metrology mark MK2 that may be used in a method of manufacturing an integrated circuit device, according to some embodiments. FIG. 4 illustrates AIM marks, which may be used in overlay measurement, as an example of the metrology mark MK2. FIG. 5 is an enlarged plan view of a portion of a region EX3 of FIG. 4.

Referring to FIG. 4, the metrology mark MK2 may include a plurality of bottom gratings BG2 and a plurality of top gratings TG2, which are arranged on or over the lower structure 10. The metrology mark MK2 may be arranged in the scribe lane area SLA described with reference to FIG. 1.

In some embodiments, the metrology mark MK2 may be used as an overlay key for measuring an overlay between feature patterns formed in the device area DA (see FIG. 1). In some embodiments, each metrology mark MK2 may be used as an alignment key for alignment between the lower structure 10 and a particular area of photolithography equipment that is used to perform a photolithography process for forming feature patterns on the lower structure 10.

Similar to the bottom grating BG1 and the top grating TG1 of the metrology mark MK1 described with reference to FIG. 1, a bottom grating BG2 and a top grating TG1 constituting the metrology mark MK2 may be respectively arranged at different vertical levels on or over the lower structure 10. Similar to the bottom grating BG1 described with reference to FIGS. 2A, 2B, and 3A to 3D, the bottom grating BG2 may be implemented with various configurations.

In the viewpoint of the X-Y plane, the top grating TG2 may be arranged adjacent to the bottom grating BG2. The top grating TG2 may include a plurality of third keys K3 constituting a line-and-space pattern. The sizes and pitch of the plurality of third keys K3, which constitute the top grating TG2, in the width direction (for example, the Y direction in FIG. 5) may be independently determined separately from the sizes and pitch of the plurality of first keys K1, which constitute a first bottom grating BG1A of the bottom grating BG2, in the width direction (for example, the Y direction in FIG. 5). In addition, the sizes and pitch of the plurality of third keys K3, which constitute the top grating TG2, in the width direction may be independently determined separately from the sizes and pitch of the plurality of second keys K2, which constitute a second bottom grating BG1B of the bottom grating BG2, in the width direction.

As shown in FIG. 5, in the viewpoint of the X-Y plane, the top grating TG2 may be arranged to be shifted from the bottom grating BG2 in the horizontal direction (the X direction or the Y direction). In some embodiments, unlike the example shown in FIG. 5, the plurality of third keys K3 constituting the top grating TG2 may each be aligned with and correspond one-to-one to one of the plurality of first keys K1 and the plurality of second keys K2, which respectively constitute the first bottom grating BG1A and the second bottom grating BG1B of the bottom grating BG2.

As shown in FIGS. 4 and 5, in the viewpoint of the X-Y plane, the plurality of first keys K1 and the plurality of second keys K2, which constitute the bottom grating BG2, may be alternately arranged one-by-one in the first horizontal direction (the X direction) or the second horizontal direction (the Y direction) that is orthogonal to the vertical direction (the Z direction). When the plurality of first keys K1 and the plurality of second keys K2 are alternately arranged one-by-one in the first horizontal direction (the X direction), the plurality of first keys K1 and the plurality of second keys K2 may be aligned in a line in the first horizontal direction (the X direction). When the plurality of first keys K1 and the plurality of second keys K2 are alternately arranged one-by-one in the second horizontal direction (the Y direction), the plurality of first keys K1 and the plurality of second keys K2 may be aligned in a line in the second horizontal direction (the Y direction).

In the metrology marks MK1 and MK2 respectively shown in FIGS. 1 and 4, an overlay at one vertical level on or over a lower structure may be measured by measuring the bottom grating BG1 or BG2 and the top grating TG1 or TG2 in various manners. In some embodiments, the overlay at the one vertical level may be measured from imaging information or scatterometry information, which is obtained from each of the bottom grating BG1 or BG2 and the top grating TG1 or TG2 of the metrology mark MK1 or MK2. In some embodiments, an overlay at a vertical level at which the top grating TG1 or TG2 is arranged may be measured by measuring a diffraction-based overlay (DBO), a micro-diffraction-based overlay (μDBO), an optical image-based overlay (IBO), or the like, which is obtained from each of the bottom grating BG1 or BG2 and the top grating TG1 or TG2 of the metrology mark MK1 or MK2.

In some embodiments, to perform IBO measurement, an overlay may be measured while the bottom grating BG1 or BG2 and the top grating TG1 or TG2 are formed not to overlap each other in the vertical direction (the Z direction), followed by calculating a center value of an image pattern obtained from each of the bottom grating BG1 or BG2 and the top grating TG1 or TG2, and then, a misalignment may be measured by using a difference between the center values.

Figure 6:
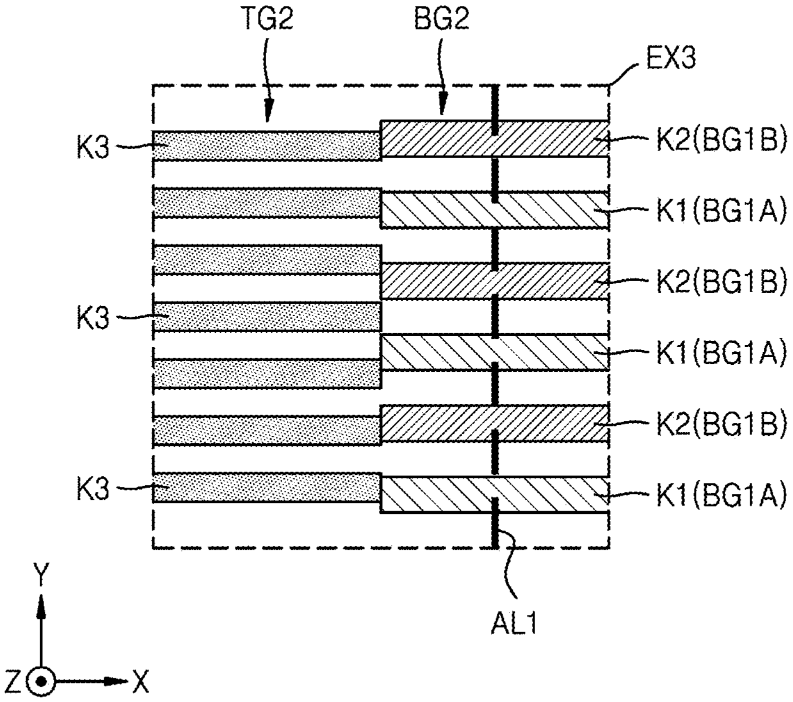
FIG. 6 is a plan view illustrating an example in which a plurality of first keys are (accurately) aligned with a plurality of second keys.

FIG. 6 is a plan view illustrating an example in which, when the plurality of first keys K1 of the bottom grating BG2 are (accurately) aligned with the plurality of second keys K2 of the bottom grating BG2, that is, when there is no misalignment between the plurality of first keys K1 and the plurality of second keys K2, the plurality of third keys K3 are formed at a vertical level that is higher than a vertical level of each of the plurality of first keys K1 and the plurality of second keys K2.

Figure 7:
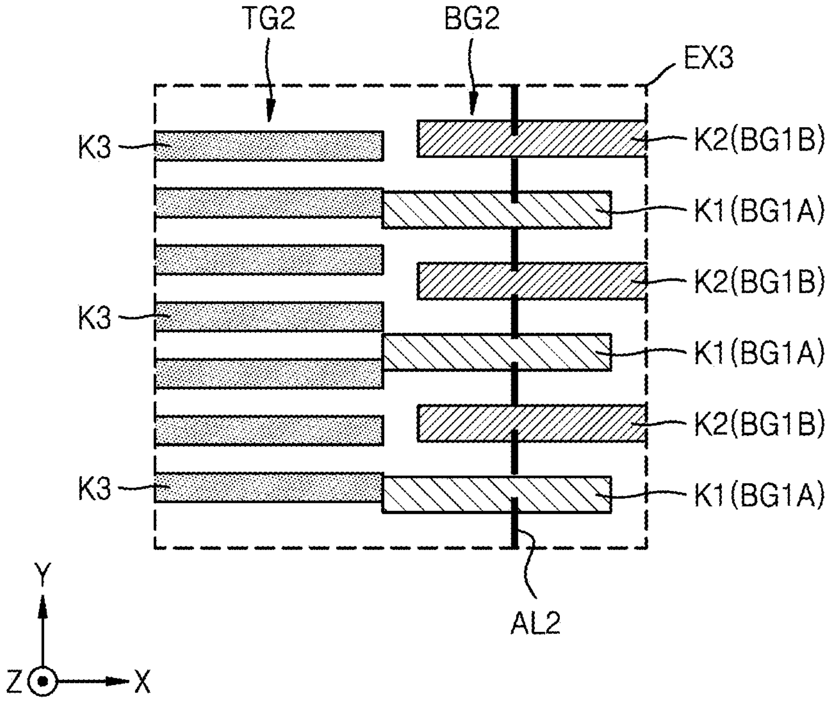
FIG. 7 is a plan view illustrating an example in which a plurality of first keys are misaligned with a plurality of second keys.

FIG. 7 is a plan view illustrating an example in which, when the plurality of first keys K1 of the bottom grating BG2 are misaligned with the plurality of second keys K2 of the bottom grating BG2, the plurality of third keys K3 are formed at a vertical level that is higher than the vertical level of each of the plurality of first keys K1 and the plurality of second keys K2.

In a method of manufacturing an integrated circuit device according to embodiments, as shown in FIGS. 6 and 7, even when the plurality of first keys K1 are variously aligned with the plurality of second keys K2, alignment measurement of the plurality of third keys K3 with respect to the plurality of first keys K1 and alignment measurement of the plurality of third keys K3 with respect to the plurality of second keys K2 are not performed separately from each other. That is, in the method of manufacturing an integrated circuit device according to embodiments, the plurality of first keys K1 and the plurality of second keys K2 are integrated into an integrated bottom grating, and a bottom grating integrated measurement value is determined from the integrated bottom grating. Next, an overlay between the top grating TG1 or TG2 and both the first and second bottom gratings BG1A and BG1B is measured by using a measurement value of the top grating TG1 or TG2 and the bottom grating integrated measurement value.

Figure 8:
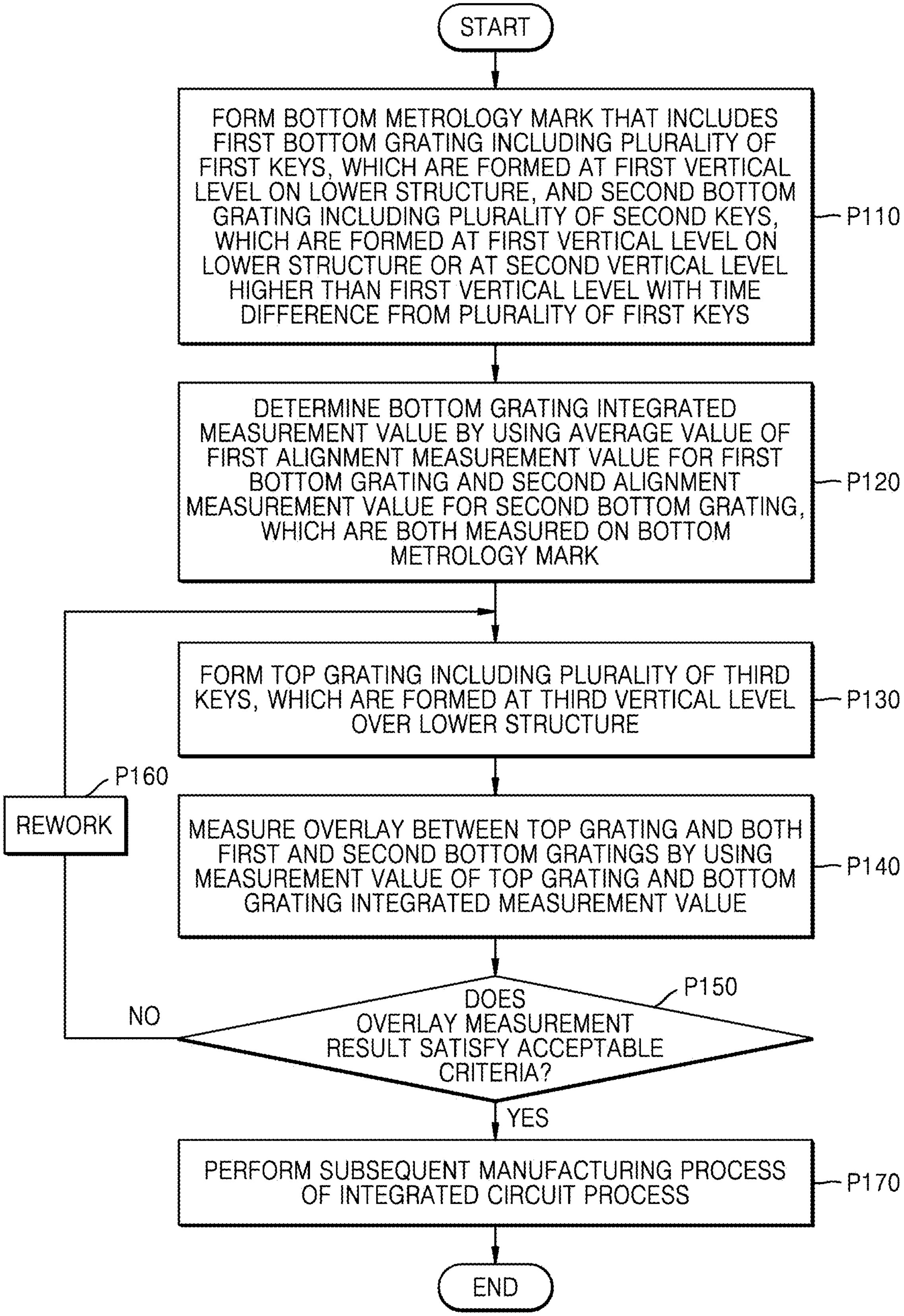
FIG. 8 illustrates a method of manufacturing an integrated circuit device, according to embodiments.

FIG. 8 illustrates a method of manufacturing an integrated circuit device, according to embodiments.

Referring to FIG. 8, in process P110, a bottom metrology mark, which includes a first bottom grating including a plurality of first keys and a second bottom grating including a plurality of second keys, may be formed, the plurality of first keys being formed at a first vertical level on a lower structure, and the plurality of second keys being formed at a second vertical level higher than the first vertical level on the lower structure and being formed with a time difference from a forming of the plurality of first keys. In other words, the plurality of first keys are formed at a first time instance, and the plurality of second keys are formed at a second distance that is different from the first time instance.

A process of forming the bottom metrology mark according to process P110 may include a process of forming the first bottom grating including the plurality of first keys in a first area at the first vertical level on the lower structure through a first photolithography process and, after the first bottom grating is formed, a process of forming, through a second photolithography process, the plurality of second keys in the first area at the first vertical level on the lower structure or in a second area that is at a second vertical level higher than the first vertical level and overlaps the first area in the vertical direction.

In an example, as shown in FIG. 3A, the plurality of first keys K1 of the first bottom grating BG1A and the plurality of second keys K2 of the second bottom grating BG1B may each include an embossed pattern and may each be formed at the first vertical level LV1 on the lower structure 10.

In another example, as shown in FIG. 3B, the plurality of first keys K1 of the first bottom grating BG1A and the plurality of second keys K2 of the second bottom grating BG1B may each include an embossed pattern, the plurality of first keys K1 may be formed at the first vertical level LV1 on the lower structure 10, and the plurality of second keys K2 may be formed at the second vertical level LV2 that is higher than the first vertical level LV1 on the lower structure 10.

In yet another example, as shown in FIG. 3C, the plurality of first keys K1 of the first bottom grating BG1A and the plurality of second keys K2 of the second bottom grating BG1B may each include an engraved pattern and may each be formed at the third vertical level LV3 that is lower than the upper surface 10T of the lower structure 10. Here, the third vertical level LV3 may correspond to the first vertical level in process P110.

In yet another example, as shown in FIG. 3D, the plurality of first keys K1 of the first bottom grating BG1A and the plurality of second keys K2 of the second bottom grating BG1B may each include an engraved pattern, the plurality of first keys K1 may be formed at the third vertical level LV3 that is lower than the upper surface 10T of the lower structure 10, and the plurality of second keys K2 may be formed at the fourth vertical level LV4 that is higher than the third vertical level LV3. Here, the third vertical level LV3 may correspond to the first vertical level in process P110, and the fourth vertical level LV4 may correspond to the second vertical level in process P110.

In some embodiments, the bottom metrology mark formed in process P110 may include the first bottom grating BG1A including the plurality of first keys K1 and the second bottom grating BG1B including the plurality of second keys K2, as shown in FIGS. 2A, 2B, and 5, and may have a configuration in which the plurality of first keys K1 and the plurality of second keys K2 are alternately arranged one-by-one in the first horizontal direction (the X direction) or the second horizontal direction (the Y direction). As shown in FIGS. 2A, 2B, 3A to 3D, and 5, the plurality of first keys K1 and the plurality of second keys K2 may be formed not to overlap each other in the vertical direction (the Z direction).

In process P120 of FIG. 8, a bottom grating integrated measurement value may be determined by using an average value (a first average value) of a first alignment measurement value for the first bottom grating and a second alignment measurement value for the second bottom grating, which are both measured on the bottom metrology mark formed in process P110.

In some embodiments, to determine the bottom grating integrated measurement value according to process P120 of FIG. 8, an average diffraction beam intensity, which is an average value (a second average value) of a first diffraction beam intensity and a second diffraction beam intensity, may be calculated, the first diffraction beam intensity being obtained from the plurality of first keys of the first bottom grating formed in process P110 of FIG. 8, and the second diffraction beam intensity being obtained from the plurality of second keys of the second bottom grating formed in process P110 of FIG. 8.

In some embodiments, a process of determining the bottom grating integrated measurement value according to process P120 of FIG. 8 may include a process of calculating an integrated image of the plurality of first keys of the first bottom grating and the plurality of second keys of the second bottom grating, which are both formed in process P110 of FIG. 8, and a process of determining the bottom grating integrated measurement value from a center line of the integrated image.

In process P130 of FIG. 8, a top grating including a plurality of third keys may be formed, the plurality of third keys being formed at a third vertical level that is higher than each of the first vertical level and the second vertical level on the lower structure. The top grating may be formed through a third photolithography process that is performed after the first photolithography process for forming the first bottom grating and the second photolithography process for forming the second bottom grating are performed.

For example, to form the top grating according to process P130 of FIG. 8, the top grating TG2 including the plurality of third keys K3 shown in FIGS. 4 and 5 may be formed. In some embodiments, the top grating TG2 including the plurality of third keys K3 may include a photoresist pattern. As shown in FIGS. 4 and 5, the plurality of third keys K3 may be formed not to overlap the plurality of first keys K1 and the plurality of second keys K2 in the vertical direction (the Z direction).

In process P140 of FIG. 8, an overlay between the top grating formed in process P130 and both the first and second gratings formed in process P110 may be measured by using a measurement value obtained from the top grating formed in process P130 and the bottom grating integrated measurement value determined in process P120.

In some embodiments, to measure the overlay between the top grating and both the first and second gratings according to process P140 of FIG. 8, DBO measurement may be used. In the DBO measurement, a power deviation may be detected for $\pm n^{-th}$-order diffracted light of a radiation beam including visible light of about 400 nm to about 800 nm, and the overlay between the top grating and both the first and second gratings may be inferred based on the power deviation for the $\pm n^{-th}$-order diffracted light. In some embodiments, when an overlay is inferred in the DBO measurement, a power deviation for $\pm 1^{st}$-order diffracted light out of diffracted light derived from the radiation beam may be used.

For example, to determine the bottom grating integrated measurement value in process P120 of FIG. 8, when the average diffraction beam intensity (which is an average value (a second average value) of a first diffraction beam intensity obtained from the plurality of first keys of the first bottom grating formed in process P110 of FIG. 8 and a second diffraction beam intensity obtained from the plurality of second keys of the second bottom grating formed in process P110 of FIG. 8) is calculated and the average diffraction beam intensity obtained as such is determined as the bottom grating integrated measurement value, to measure the overlay between the top grating and both the first and second gratings according to process P140, the overlay between the top grating and both the first and second gratings may be measured based on a diffraction beam intensity obtained from the plurality of third keys (for example, the plurality of third keys K3 of the top grating TG2 shown in FIG. 5) of the top grating and based on the average diffraction beam intensity determined as the bottom grating integrated measurement value in process P120 of FIG. 8.

In some embodiments, to measure the overlay between the top grating and both the first and second gratings according to process P140 of FIG. 8, IBO measurement may be used. In the IBO measurement, an optical microscope, or an electron microscope, such as a scanning electron microscope (SEM) or a transmission electron microscope (TEM), may be used.

For example, to determine the bottom grating integrated measurement value in process P120 of FIG. 8, when an integrated image of the plurality of first keys of the first bottom grating and the plurality of second keys of the second bottom grating (which are both formed in process P110 of FIG. 8) is calculated and information about a center line of the integrated image in the first horizontal direction is determined as the bottom grating integrated measurement value, to measure the overlay between the top grating and both the first and second gratings according to process P140, a center coordinate obtained from the plurality of third keys (for example, the plurality of third keys K3 of the top grating TG2 shown in FIG. 5) of the top grating may be calculated, and then, the overlay between the top grating and both the first and second gratings may be measured based on a relative difference between the center coordinate and the center line, for example, a center line AL1 or a center line AL2, which is determined as the bottom grating integrated measurement value in process P120 of FIG. 8, the center line AL1 being indicated by a dashed line in FIG. 6 and following the second horizontal direction (the Y direction), and the center line AL2 being indicated by a dashed line in FIG. 7 and following the second horizontal direction (the Y direction).

In process P150 of FIG. 8, it may be determined whether an overlay result measured in process P140 satisfies acceptable criteria.

When it is determined in process P150 that the overlay result does not satisfy the acceptable criteria, a rework for the third photolithography process may be performed in process P160. For example, the rework may include removing the plurality of third keys K3 of the top grating TG2, which is formed on the lower structure 10 shown in FIGS. 4 and 5, and patterns (for example, photoresist patterns) formed on the lower structure 10 in the device area DA simultaneously with the formation of the plurality of third keys K3 through the third photolithography process on the lower structure 10, and performing the process according to process P130 again.

When it is determined in process P150 that the overlay result satisfies the acceptable criteria, subsequent processes required to manufacture the integrated circuit device may be performed on the lower structure 10 including the plurality of third keys K3 of the top grating TG2, in process P170. The subsequent processes may include various processes, such as a deposition process, a photolithography process, an etching process, an ion implantation process, and a cleaning process. In addition, the subsequent processes may include a singulation process for individualizing the lower structure 10 into a plurality of semiconductor chips, a test process for testing the plurality of semiconductor chips, a packaging process for packaging the plurality of semiconductor chips, and the like.

Figure 9:
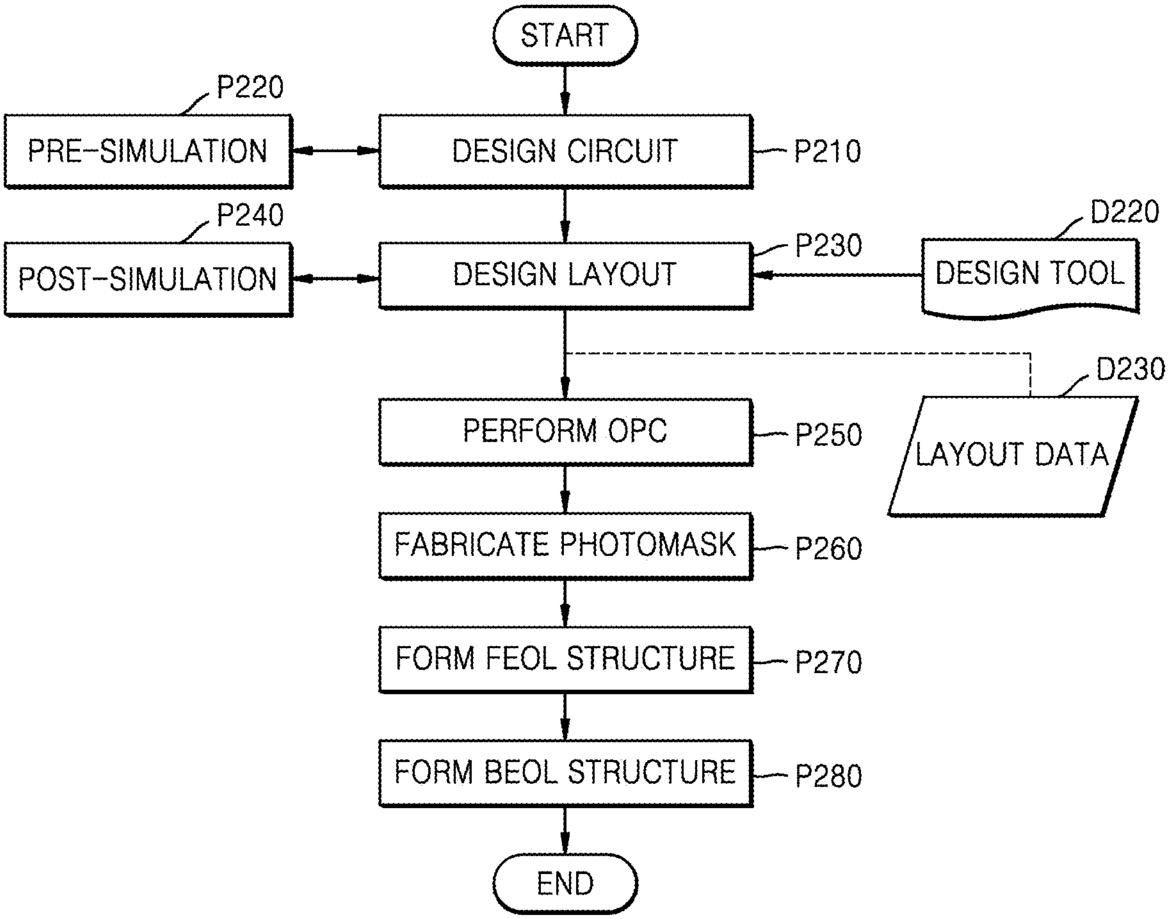
FIG. 9 illustrates a method of manufacturing an integrated circuit device, according to some embodiments.

FIG. 9 illustrates a method of manufacturing an integrated circuit device, according to some embodiments.

Referring to FIG. 9, in process P210, circuit design may be performed. For example, various devices (for example, a transistor and the like) may be designed to satisfy the performance of an integrated circuit device intended to be formed. In some embodiments, the circuit design may be performed by a circuit design tool that provides a user interface to a designer.

The circuit design according to process P210 may be performed by referring to a result of a pre-simulation performed in process P220. For example, the pre-simulation may be performed to test the performance of a designed circuit, and a structure of the circuit may be modified according to the result of the pre-simulation.

In process P230, layout design may be performed. In some embodiments, the layout design may be performed by a layout design tool.

The layout design according to process P230 may be performed by referring to a result of a post-simulation performed in process P240. A layout designed in process P230 may be modified according to the result of the post-simulation.

The layout design according to process P230 may be performed based on a design rule D220. The design rule D220 may define a plurality of rules based on a process of manufacturing the integrated circuit device. For example, the design rule D220 may define a pitch of patterns, a space between patterns, and the like, which are allowed in the same conductive layer. The layout of the integrated circuit device may be designed to comply with the plurality of rules defined by the design rule D220.

When the layout design is completed in process P230, layout data D230 defining the layout may be generated. The layout data D230 may include geometric information of patterns that are included in the integrated circuit device intended to be formed.

In process P250, optical proximity correction (OPC) may be performed. The OPC may collectively refer to operations of forming a pattern with an intended shape by correcting a distortion phenomenon, such as refraction due to characteristics of light in a photolithography process performed during the process of manufacturing the integrated circuit device.

By applying the OPC to the layout data D230 that is a resulting product of the layout designed in process P230, a pattern on a photomask to be fabricated in process P260 subsequent to the OPC may be determined. In some embodiments, the layout of the integrated circuit device may be restrictively modified in a process of performing the OPC according to process P250.

In process P260, a photomask may be fabricated. For example, as the OPC is applied to the layout data D230, patterns required to form the plurality of patterns may be defined on the photomask, and at least one photomask for forming patterns of each of a plurality of layers may be fabricated.

In process P270, a front-end-of-line (FEOL) process for manufacturing the integrated circuit device may be performed, thereby forming an FEOL structure on a lower structure.

In the FEOL process, individual devices may be formed on a substrate. The individual devices may include, but are not limited to, a transistor, a capacitor, a resistor, and the like. The FEOL process may include a photolithography process, a planarization process of structures, a cleaning process, an etching process, a deposition process, an ion implantation process, a conductive film forming process, an insulating film forming process, and the like, for forming the FEOL structure.

In process P280, a back-end-of-line (BEOL) process may be performed on a resulting product in which the FEOL structure is formed, thereby forming a BEOL structure.

The BEOL process may include processes of electrically connecting, to each other, the individual devices of the FEOL structure formed in process P270. The BEOL process may include a photolithography process, a process of forming a plurality of conductive films, a process of forming a plurality of conductive via contacts, a silicidation process, a plating process, an insulating film forming process, a passivation film forming process, and the like, for forming the BEOL structure. A resulting product obtained by performing the BEOL process according to process P280 may be packaged and used as a component of various applications.

At least one process out of the formation process of the FEOL structure according to process P270 of FIG. 9 and the formation process of the BEOL structure according to process P280 of FIG. 9 may include a process of measuring an overlay between an upper pattern and a lower pattern on the lower structure by performing processes P110, P120, P130, P140, and P150 described with reference to FIG. 8.

According to a method of manufacturing an integrated circuit device, according to the disclosure, by reducing the area required to form a bottom metrology mark that is used in a photolithography process performed on a lower structure, the area provided to arrange a cell array on the lower structure may be increased, and the time required for overlay measurement and/or alignment measurement performed by using the bottom metrology mark may be reduced, thereby reducing turnaround time (TAT) and improving throughput, in a manufacturing process of the integrated circuit device.

While the disclosure has been particularly shown and described with reference to embodiments of the disclosure, various changes in form and details may be made therein without departing from the spirit and scope of the following claims.

What is claimed is:

1. A method of manufacturing an integrated circuit device, the method comprising:

forming a bottom metrology mark that comprises:

a first bottom grating including a plurality of first keys, and a second bottom grating including a plurality of second keys, wherein the plurality of first keys are formed at a first vertical level on a lower structure and at a first time instance, and wherein the plurality of second keys are formed, at the first vertical level on the lower structure or at a second vertical level that is higher than the first vertical level, at a second time instance that is different from the first time instance;

determining a bottom grating integrated measurement value, based on a first average value of a first alignment measurement value for the first bottom grating and a second alignment measurement value for the second bottom grating, wherein the first alignment measurement value and the second alignment measurement value are measured on the bottom metrology mark;

forming a top grating including a plurality of third keys that are formed at a third vertical level that is higher than each of the first vertical level and the second vertical level on the lower structure; and measuring an overlay between the top grating and both of the first bottom grating and the second bottom grating, based on a measurement value of the top grating and based on the bottom grating integrated measurement value.

2. The method of claim 1, wherein the forming of the bottom metrology mark comprises forming the bottom metrology mark in a structure in which the plurality of first keys and the plurality of second keys are alternately arranged one-by-one in a first horizontal direction that is orthogonal to a vertical direction in a plan view.

3. The method of claim 1, wherein the determining of the bottom grating integrated measurement value comprises calculating an average diffraction beam intensity that is a second average value of a first diffraction beam intensity and a second diffraction beam intensity, wherein the first diffraction beam intensity is obtained from the plurality of first keys of the first bottom grating, wherein the second diffraction beam intensity is obtained from the plurality of second keys of the second bottom grating, and wherein the measuring of the overlay comprises measuring the overlay based on the average diffraction beam intensity and based on a diffraction beam intensity that is obtained, based on diffraction-based overlay (DBO) measurement, from the plurality of third keys.

4. The method of claim 1, wherein the determining of the bottom grating integrated measurement value comprises:

calculating an integrated image of the plurality of first keys and the plurality of second keys of the bottom metrology mark, and determining the bottom grating integrated measurement value from a center line of the integrated image, and wherein the measuring of the overlay comprises measuring the overlay, based on a relative difference between the center line of the integrated image and a center coordinate of an image that is obtained, based on image-based overlay (IBO) measurement, from the plurality of third keys.

5. The method of claim 4, wherein the forming of the bottom metrology mark comprises forming the bottom metrology mark in a structure in which the plurality of first keys and the plurality of second keys are alternately arranged one-by-one in a first horizontal direction that is orthogonal to a vertical direction in a plan view, and wherein, in the determining of the bottom grating integrated measurement value, the center line of the integrated image follows the first horizontal direction.

6. The method of claim 1, wherein the forming of the bottom metrology mark comprises forming the plurality of second keys at the first vertical level.

7. The method of claim 1, wherein the forming of the bottom metrology mark comprises forming the plurality of second keys at the second vertical level.

8. The method of claim 1, wherein the forming of the top grating comprises forming the plurality of third keys not to overlap the plurality of first keys and the plurality of second keys in a vertical direction.

9. The method of claim 1, wherein, in the forming of the bottom metrology mark, at least one of the plurality of first keys includes an embossed pattern, and at least one of the plurality of second keys includes the embossed pattern.

10. The method of claim 1, wherein, in the forming of the bottom metrology mark, at least one of the plurality of first keys includes an engraved pattern, and at least one of the plurality of second keys includes the engraved pattern.

11. A method of manufacturing an integrated circuit device, the method comprising:

forming a front-end-of-line (FEOL) structure on a lower structure; and forming a back-end-of-line (BEOL) structure on the FEOL structure, wherein at least one of the forming of the FEOL structure and the forming of the BEOL structure includes measuring an overlay between an upper pattern and a lower pattern on the lower structure, and wherein the measuring of the overlay includes:

forming a bottom metrology mark that includes:

a first bottom grating including a plurality of first keys and a second bottom grating including a plurality of second keys, wherein the plurality of first keys are formed, at a first vertical level on the lower structure, at a first time instance, wherein the plurality of second keys are formed at the first vertical level on the lower structure or at a second vertical level that is higher than the first vertical level, at a second time distance that is different from the first time instance;

determining a bottom grating integrated measurement value, based on a first average value of a first alignment measurement value for the first bottom grating and a second alignment measurement value for the second bottom grating, wherein the first alignment measurement value and the second alignment measurement value are measured on the bottom metrology mark;

forming a top grating including a plurality of third keys, which are formed at a third vertical level that is higher than each of the first vertical level and the second vertical level on the lower structure; and measuring an overlay between the top grating and both the first bottom grating and the second bottom grating, based on a measurement value of the top grating and based on the bottom grating integrated measurement value.

12. The method of claim 11, wherein the forming of the bottom metrology mark comprises forming the bottom metrology mark in a structure in which the plurality of first keys and the plurality of second keys are alternately arranged one-by-one in a first horizontal direction that is orthogonal to a vertical direction in a plan view.

13. The method of claim 11, wherein the determining of the bottom grating integrated measurement value comprises calculating an average diffraction beam intensity that is a second average value of a first diffraction beam intensity and a second diffraction beam intensity, wherein the first diffraction beam intensity is obtained from the plurality of first keys of the first bottom grating, and the second diffraction beam intensity is obtained from the plurality of second keys of the second bottom grating, and wherein the measuring of the overlay comprises the measuring the overlay, based on the average diffraction beam intensity and based on a diffraction beam intensity that is obtained, based on diffraction-based overlay (DBO) measurement, from the plurality of third keys.

14. The method of claim 11, wherein the forming of the bottom metrology mark comprises forming the bottom metrology mark in a structure in which the plurality of first keys and the plurality of second keys are alternately arranged one-by-one in a first horizontal direction that is orthogonal to a vertical direction in a plan view, wherein the determining of the bottom grating integrated measurement value comprises:

calculating an integrated image of the plurality of first keys and the plurality of second keys of the bottom metrology mark, and determining the bottom grating integrated measurement value from a center line of the integrated image, the center line following the first horizontal direction, and wherein the measuring of the overlay comprises measuring the overlay, based on a relative difference between the center line of the integrated image and a center coordinate of an image that is obtained, based on image-based overlay (IBO) measurement, from the plurality of third keys.

15. A method of manufacturing an integrated circuit device, the method comprising:

forming a first bottom grating, which includes a plurality of first keys, in a first area at a first vertical level on a lower structure through a first photolithography process;

after the first bottom grating is formed, forming, through a second photolithography process, a second bottom grating, which includes a plurality of second keys, in the first area at the first vertical level on the lower structure or in a second area that is at a second vertical level higher than the first vertical level and that overlaps the first area in a vertical direction;

determining a bottom grating integrated measurement value, based on an alignment measurement value measured on a bottom metrology mark including a combination of the first bottom grating and the second bottom grating;

forming a top grating, which includes a plurality of third keys, at a third vertical level that is higher than each of the first vertical level and the second vertical level on the lower structure, through a third photolithography process; and measuring an overlay between the top grating and both the first bottom grating and the second bottom grating, based on a measurement value of the top grating and based on the bottom grating integrated measurement value.

16. The method of claim 15, wherein the forming of the second bottom grating comprises forming the plurality of second keys in the first area at the first vertical level, and wherein the forming of the plurality of second keys comprises forming the plurality of second keys such that the plurality of first keys and the plurality of second keys are alternately arranged one-by-one in a first horizontal direction that is orthogonal to the vertical direction in a plan view.

17. The method of claim 15, wherein the forming of the second bottom grating comprises forming the plurality of second keys in the second area at the second vertical level, and wherein the forming of the plurality of second keys comprises forming the plurality of second keys such that the plurality of first keys and the plurality of second keys are alternately arranged one-by-one in a first horizontal direction that is orthogonal to the vertical direction in a plan view.

18. The method of claim 15, wherein the determining of the bottom grating integrated measurement value comprises calculating an average diffraction beam intensity that is a second average value of a first diffraction beam intensity and a second diffraction beam intensity, wherein the first diffraction beam intensity is obtained from the plurality of first keys of the first bottom grating, and the second diffraction beam intensity is obtained from the plurality of second keys of the second bottom grating, and wherein the measuring of the overlay comprises measuring the overlay based on the average diffraction beam intensity and based on a diffraction beam intensity that is obtained, based on diffraction-based overlay (DBO) measurement, from the plurality of third keys.

19. The method of claim 15, wherein the determining of the bottom grating integrated measurement value comprises calculating an integrated image of the plurality of first keys and the plurality of second keys of the bottom metrology mark and determining the bottom grating integrated measurement value from a center line of the integrated image, and wherein the measuring of the overlay comprises measuring the overlay, based on a relative difference between the center line of the integrated image and a center coordinate of an image that is obtained, based on image-based overlay (IBO) measurement, from the plurality of third keys.

20. The method of claim 19, wherein the forming of the second bottom grating comprises forming the plurality of second keys such that the plurality of first keys and the plurality of second keys are alternately arranged one-by-one in a first horizontal direction that is orthogonal to the vertical direction in a plan view, and wherein, in the determining of the bottom grating integrated measurement value, the center line of the integrated image follows the first horizontal direction.

* * * * *